United States Patent
Hu

(10) Patent No.: US 10,032,702 B2
(45) Date of Patent: Jul. 24, 2018

(54) PACKAGE STRUCTURE AND MANUFACTURING METHOD THEREOF

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 15/677,038

(22) Filed: Aug. 15, 2017

(65) Prior Publication Data
US 2018/0166371 A1    Jun. 14, 2018

(51) Int. Cl.
| | |
|---|---|
| *H01L 23/48* | (2006.01) |
| *H01L 23/498* | (2006.01) |
| *H01L 21/48* | (2006.01) |
| *H01L 21/56* | (2006.01) |

(52) U.S. Cl.
CPC .... *H01L 23/49822* (2013.01); *H01L 21/4853* (2013.01); *H01L 21/4857* (2013.01); *H01L 21/563* (2013.01); *H01L 23/49833* (2013.01); *H01L 23/49838* (2013.01); *H01L 23/49866* (2013.01); *H01L 23/49811* (2013.01)

(58) Field of Classification Search
None
See application file for complete search history.

(56) References Cited

U.S. PATENT DOCUMENTS

| | | | | |
|---|---|---|---|---|
| 9,263,373 B2 * | 2/2016 | Hu | ...................... | H01L 21/4825 |
| 9,431,335 B2 | 8/2016 | Hu | | |
| 9,911,718 B2 * | 3/2018 | Prabhu | .................. | H01L 21/486 |
| 2003/0122244 A1 * | 7/2003 | Lin | ...................... | H01L 23/3114 |
| | | | | 257/700 |
| 2008/0003716 A1 * | 1/2008 | Takahashi | ........... | H01L 21/6835 |
| | | | | 438/108 |
| 2015/0318262 A1 * | 11/2015 | Gu | .................... | H01L 23/49811 |
| | | | | 257/738 |
| 2017/0179078 A1 * | 6/2017 | Jung | ....................... | H01L 25/50 |

FOREIGN PATENT DOCUMENTS

| | | |
|---|---|---|
| CN | 102543927 | 12/2014 |
| CN | 204614786 | 9/2015 |
| TW | 201618260 | 5/2016 |

OTHER PUBLICATIONS

"Office Action of Taiwan Counterpart Application", dated Apr. 27, 2018, p. 1-p. 11.

* cited by examiner

*Primary Examiner* — Ali Naraghi
(74) *Attorney, Agent, or Firm* — JCIPRNET

(57) ABSTRACT

A package structure including a first redistribution circuitry and a second redistribution circuitry is provided. The first redistribution circuitry has a plurality of first top conductive pads and a plurality of first bottom conductive pads. A layout density of the first bottom conductive pads is greater than a layout density of the first top conductive pads. The second redistribution circuitry is disposed on the first redistribution circuitry and electrically connected to the first redistribution circuitry. The second redistribution circuitry has a plurality of second top conductive pads and a plurality of second bottom conductive pads. A layout density of the second bottom conductive pads is greater than a layout density of the second top conductive pads. Each of the second bottom conductive pads is directly coupled to a corresponding one of the first top conductive pads. A manufacturing method of a package structure is also provided.

11 Claims, 4 Drawing Sheets

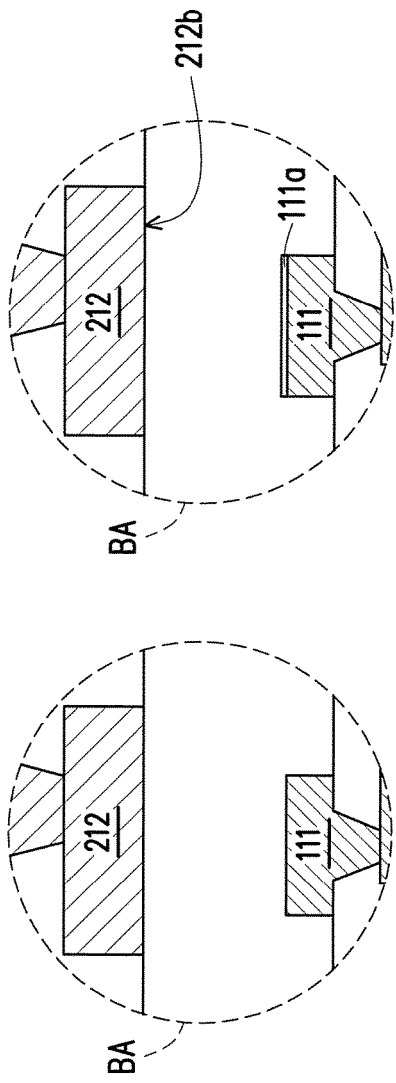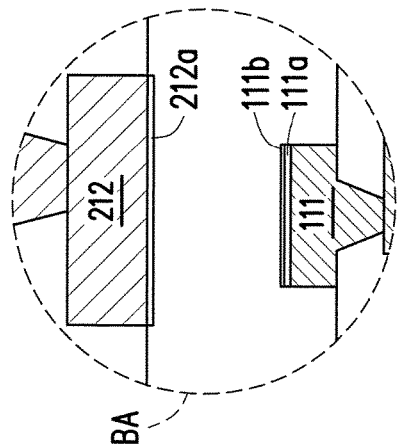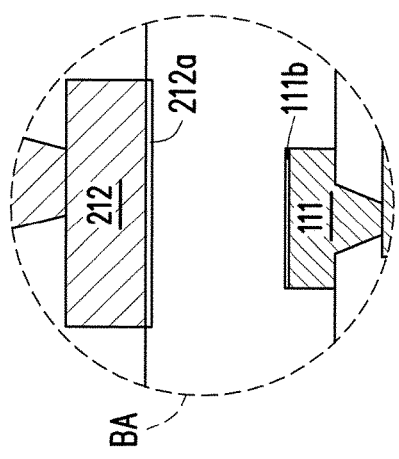

PACKAGE STRUCTURE AND MANUFACTURING METHOD THEREOF

CROSS REFERENCE TO RELATED APPLICATION

This application claims the priority benefit of U.S. provisional application Ser. No. 62/431,999, filed on Dec. 9, 2016. The entirety of the above-mentioned patent application is hereby incorporated by reference herein and made a part of specification.

BACKGROUND OF THE INVENTION

1. Field of the Invention

The present invention relates to a package structure, especially relates to a package structure with copper to copper direct bonding structure.

2. Description of Related Art

Conventionally, taking U.S. Pat. No. 9,431,335 B2 for example, a package substrate for integrated circuit (IC) comprises a molding compound between a top redistribution layer and a bottom redistribution layer, a plurality of metal pillars partially embedded in the molding compound, each metal pillar having a top end connected to a corresponding metal pads within the top redistribution layer and having a bottom end connected to a corresponding metal pads within the bottom redistribution layer. A chip is mounted on a bottom side of the plurality of bottom metal pads within the bottom redistribution layer, underfill material is filled in a gap between the chip and the plurality of bottom metal pads and a plurality of solder balls configured on a top side of the plurality of top metal pads. The disadvantage for the prior art mentioned above is that the copper pillars occupy a substantial thickness for the package substrate. As such, miniaturizing the package structure while maintaining the process simplicity has become a challenge to researchers in the field.

SUMMARY OF THE INVENTION

The invention provides a package structure and a manufacturing method thereof, which miniaturizing the package structure while maintaining the process simplicity.

The invention provides a package structure including a first redistribution circuitry and a second redistribution circuitry. The first redistribution circuitry has a plurality of first top conductive pads and a plurality of first bottom conductive pads. A layout density of the first bottom conductive pads is greater than a layout density of the first top conductive pads. The second redistribution circuitry is disposed on the first redistribution circuitry and electrically connected to the first redistribution circuitry. The second redistribution circuitry has a plurality of second top conductive pads and a plurality of second bottom conductive pads. A layout density of the second bottom conductive pads is greater than a layout density of the second top conductive pads. Each of the second bottom conductive pads is directly coupled to a corresponding one of the first top conductive pads.

The invention provides a manufacturing method of a package structure. The method includes the following steps. A first redistribution circuitry is provided. The first redistribution circuitry has a plurality of first top conductive pads and a plurality of first bottom conductive pads. A layout density of the first bottom conductive pads is greater than a layout density of the first top conductive pads. A second redistribution circuitry is provided. The second redistribution circuitry has a plurality of second top conductive pads and a plurality of second bottom conductive pads. A layout density of the second bottom conductive pads is greater than a layout density of the second top conductive pads. The first top conductive pads of the first redistribution circuitry and the second bottom conductive pads of the second redistribution circuitry are bonded.

Based on the above, the package structure can be formed thinner than a conventional package structure, since the first redistribution circuitry is directly bonded to the second redistribution circuitry without having conductive pillars formed therebetween. Therefore, miniaturizing the package structure while maintaining the process simplicity is achieved.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2E are schematic cross-sectional views of bonding area in FIG. 1A of different embodiments.

DESCRIPTION OF THE EMBODIMENTS

Figure 1A:
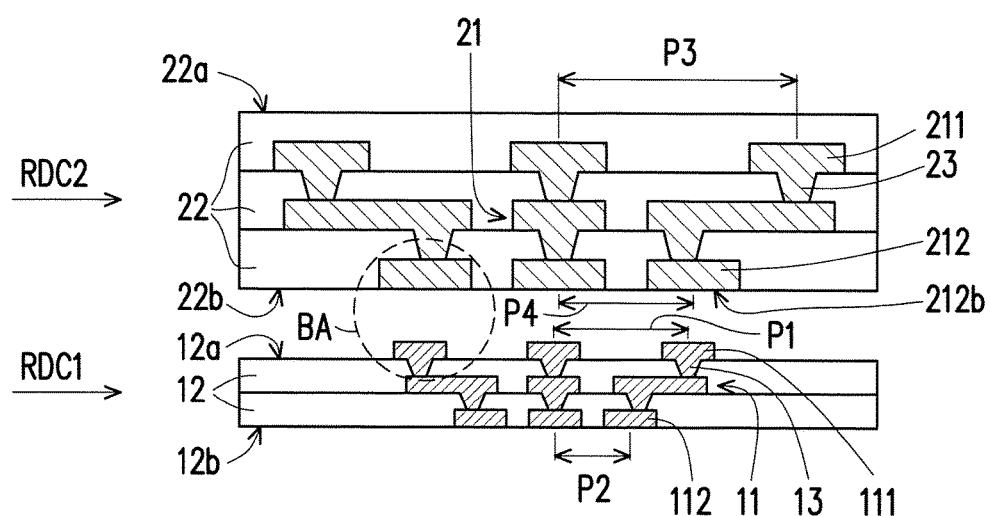
FIG. 1A to FIG. 1E are schematic cross-sectional views illustrating a manufacturing method of a package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are schematic cross-sectional views illustrating a manufacturing method of an electronic package according to an embodiment of the invention. Referring to FIG. 1A, a first redistribution circuitry RDC1 is provided. A second redistribution circuitry RDC2 is provided. The forming sequence of the first redistribution circuitry RDC1 and the second redistribution circuitry RDC2 construes no limitation in the disclosure. In some embodiments, the first redistribution circuitry RDC1 has a plurality of first top conductive pads 111 and a plurality of first bottom conductive pads 112. A layout density of the first bottom conductive pads 112 is greater than a layout density of the first top conductive pads 111. For example, the pitch P1 between the adjacent first top conductive pads 111 may be greater than the pitch P2 between the adjacent first bottom conductive pads 112. In some embodiments, the first redistribution circuitry RDC1 has a plurality of first patterned conductive layers 11 and a plurality of first conductive vias 13 electrically coupling the first patterned conductive layers 11. In some other embodiments, the first redistribution circuitry RDC1 has a plurality of first dielectric layers 12 overlapped with the first patterned conductive layers 11 alternately.

For example, the first bottom conductive pads 112 may be formed on a temporary carrier (not illustrated). Next, the bottommost one of the first dielectric layers 12 may be formed over the first bottom conductive pads 112 and then a portion of the bottommost one of the first dielectric layers 12 is removed to form a plurality of openings to expose at least a portion of the first bottom conductive pads 112 using, for example, a photolithography and an etching process. In some other embodiments, the first dielectric layer 12 may be formed before the first bottom conductive pads 112. The forming sequence of the first bottom conductive pads 112 and the first dielectric layer 12 construes no limitation in the disclosure. Subsequently, the first conductive vias 13 may fill the openings of the bottommost one of the first dielectric layers 12 and the first patterned conductive layers 11 electrically coupling to the conductive vias 13 may be formed on the bottommost one of the first dielectric layers 12.

In some embodiments, the abovementioned steps may be performed multiple times to obtain the multi-layered first redistribution circuitry RDC1 as required by the circuit design. For example, a topmost one of the first dielectric layers 12 may be formed over the first patterned conductive layers 11 and a portion of the topmost one of the first dielectric layers 12 is removed to form a plurality of openings to expose at least a portion of the first patterned conductive layers 11. Next, the first conductive vias 13 may fill the openings of the topmost one of the first dielectric layers 12 and the first top conductive pads 111 may be formed on the first conductive vias 13 and on a top surface 12a of the topmost one of the first dielectric layers 12. After forming the first top conductive pads 111, the temporary carrier may be removed to expose a bottom surface 12b of the bottommost one of the first dielectric layers 12 facing away the top surface 12a of the topmost one of the first dielectric layers 12. As such, the first top conductive pads 111 may protrude from the top surface 12a of the topmost one of the first dielectric layers 12 for further electrical connection. The bottom surface 12b of the bottommost one of the first dielectric layers 12 may be coplanar with a bottom surface 112b of the first bottom conductive pads 112 facing away the second redistribution circuitry RDC2.

The second redistribution circuitry RDC2 has a plurality of second top conductive pads 211 and a plurality of second bottom conductive pads 212. A layout density of the second bottom conductive pads 212 is greater than a layout density of the second top conductive pads 211. For example, the pitch P3 between the adjacent second top conductive pads 211 may be greater than the pitch P4 between the adjacent second bottom conductive pads 212, and the pitch P4 may be equal to the pitch P1 between the adjacent first top conductive pads 111. In some other embodiments, the pitch P3 may be greater than the pitch P1 between the adjacent first top conductive pads 111. However, the pitches (e.g. P1 to P4) depend on the design requirements, which is not limited thereto. The second redistribution circuitry RDC2 has a plurality of second patterned conductive layers 21 and a plurality of second conductive vias 23 electrically coupling the second patterned conductive layers 21. In some other embodiments, the second redistribution circuitry RDC2 has a plurality of second dielectric layers 22 overlapped with the second patterned conductive layers 21 alternately. The forming processes of the second redistribution circuitry RDC2 may be similar with the forming process of the first redistribution circuitry RDC1 and the detailed descriptions are omitted therein.

For example, a topmost one of the second dielectric layers 22 has a top surface 22a and a bottommost one of the second dielectric layers 22 has a bottom surface 22b facing away the top surface 22a of the topmost one of the second dielectric layers 22. In some embodiments, the bottom surface 22b of the bottommost one of the second dielectric layers 22 may be coplanar with a bottom surface 212b of the second bottom conductive pads 212 facing towards the first redistribution circuitry RDC1. After forming the first redistribution circuitry RDC1 and the second redistribution circuitry RDC2, the second redistribution circuitry RDC2 is disposed on the first redistribution circuitry RDC1 such that the second bottom conductive pads 212 and the first top conductive pads 111 face towards each other and the pre-bonding area BA is shown as FIG. 1A. The greater detailed descriptions of the pre-bonding area BA will be described later in other embodiments.

Figure 1B:
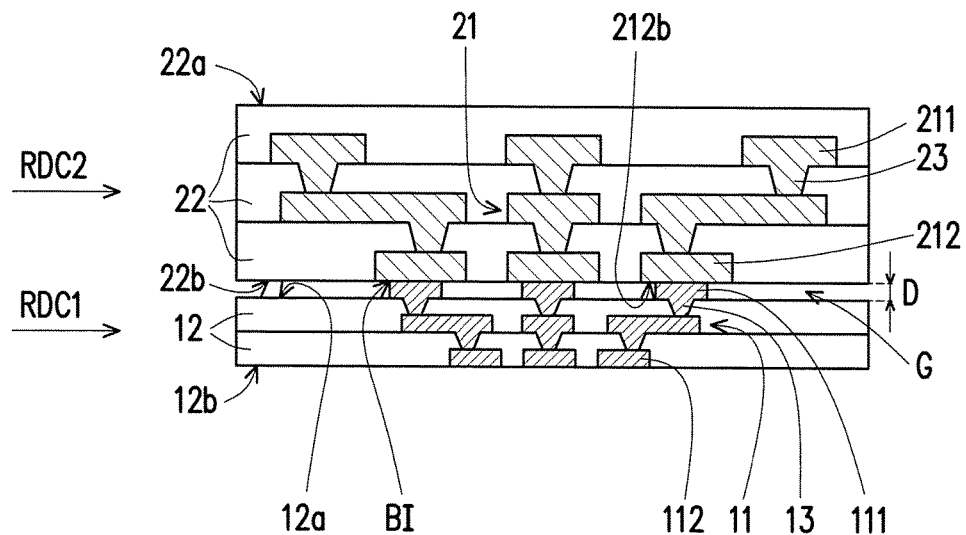

Referring to FIG. 1B, the first top conductive pads 111 of the first redistribution circuitry RDC1 and the second bottom conductive pads 212 of the second redistribution circuitry RDC2 are bonded and electrically connected to each other. For example, the bottom surface 212b of the second bottom conductive pads 212 may be aligned with a corresponding first top conductive pad 111. For each pair of the bonded conductive pads (e.g. the second bottom conductive pad 212 and the corresponding first top conductive pad 111), a metallic bonding occurs due to surface diffusion in a bonding interface BI between the second bottom conductive pad 212 and the corresponding first top conductive pad 111 under predetermined temperature, pressure, and atmosphere. No solder material or equivalent is used between the second bottom conductive pad 212 and the corresponding first top conductive pad 111. In some embodiments, for each pair of the bonded conductive pads, the area of the second bottom conductive pad 212 may be greater than the area of the corresponding first top conductive pad 111 and the corresponding first top conductive pad 111 may partially cover the second bottom conductive pad 212 at the bonding interface BI.

In some embodiments, after bonding the first top conductive pads 111 of the first redistribution circuitry RDC1 and the second bottom conductive pads 212 of the second redistribution circuitry RDC2, a gap G may be formed between the topmost one of the first dielectric layers 12 of the first redistribution circuitry RDC1 and the bottommost one of the second dielectric layers 22 of the second redistribution circuitry RDC2. For example, a distance D of the gap G may be between the top surface 12a of the topmost one of the first dielectric layers 12 and the bottom surface 22b of the bottommost one of the second dielectric layers 22. In some embodiments, the distance D of the gap G may be equal to a thickness of the first top conductive pads 111 of the first redistribution circuitry RDC1.

In some embodiments, after bonding the first top conductive pads 111 of the first redistribution circuitry RDC1 and the second bottom conductive pads 212 of the second redistribution circuitry RDC2, a bonding interface BI may be formed between the first top conductive pad 111 and the corresponding second bottom conductive pads 212. For example, the bonding interface BI may be a copper to copper metallic bonding. In some other embodiments, before bonding the first top conductive pads 111 of the first redistribution circuitry RDC1 and the second bottom conductive pads 212 of the second redistribution circuitry RDC2, an impurity may be applied on at least one of the first top conductive pads 111 or at least one of the second bottom conductive pads 212. The detailed descriptions will be described later in other embodiments.

Figure 1C:
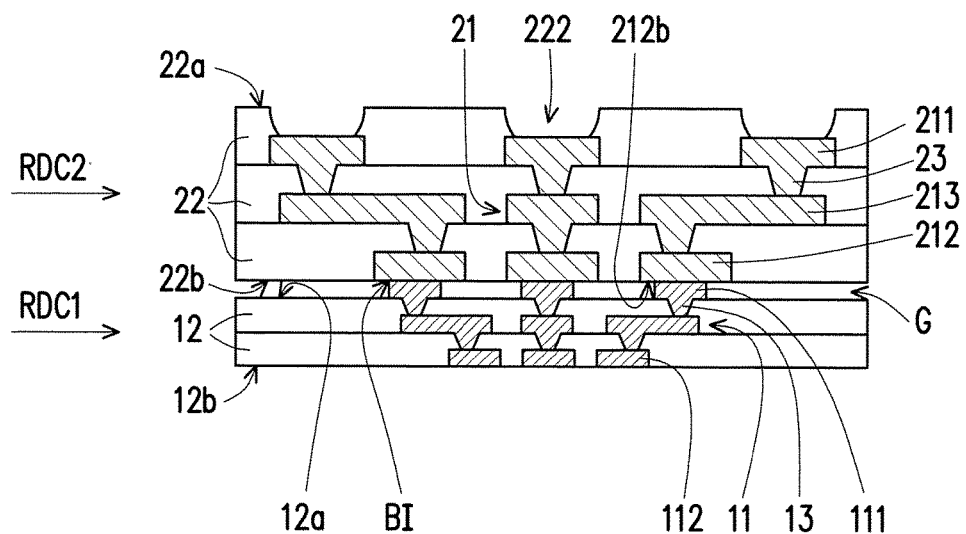

Referring to FIG. 1C, after bonding the first top conductive pads 111 of the first redistribution circuitry RDC1 and the second bottom conductive pads 212 of the second redistribution circuitry RDC2, a plurality of openings 222 may be formed on the topmost one of the second dielectric layer 22 to expose at least a portion of the second top conductive pads 211 for further electrical connection.

Figure 1D:
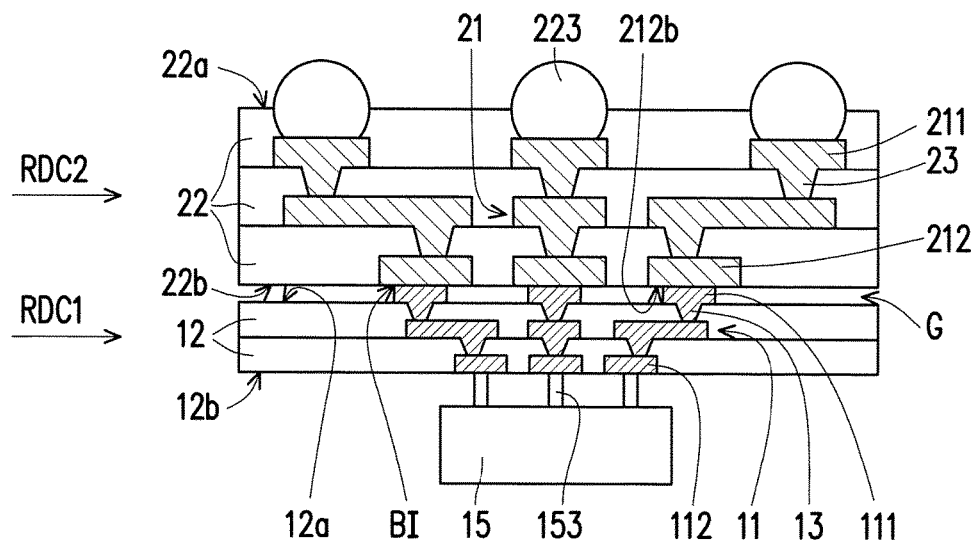

Referring to FIG. 1D, a plurality of conductive terminals 223 may be formed on the second redistribution circuitry RDC2 opposite to the first redistribution circuitry RDC1. For example, the conductive terminal 223 may be formed in the openings 222 of the topmost one of the second dielectric layers 22 using a ball placement process, a plating process or other suitable process. The conductive terminals 223 may include conductive pillars, conductive bumps or a combination thereof. However, it construes no limitation in the disclosure. Other possible forms and shapes of the conductive terminals 223 may be utilized according to the design requirement. Moreover, a soldering process and a reflowing process are optionally performed for enhancement of the adhesion between the conductive terminals 223 and the second redistribution circuitry RDC2. After forming the conductive terminals 223, the conductive terminals 223 may be electrically connected to the first redistribution circuitry RDC1 through the second redistribution circuitry RDC2.

In some embodiments, an electronic component 15 may be disposed on the first redistribution circuitry RDC1 opposite to the second redistribution circuitry RDC2. For example, the electronic component 15 may be a semiconductor chip or the like, which is not limited thereto. In some embodiments, the electronic component 15 may include a plurality of conductive connectors 153. The conductive connectors 153 may include conductive pads (e.g., aluminum pads, copper pads or the like), conductive pillars (e.g. solder pillars, gold pillars, copper pillars or the like), conductive bumps (e.g., reflowed solder bumps, gold bumps, copper bumps or the like) or the combinations thereof. However, it construes no limitation in the disclosure. For example, the conductive connectors 153 may be correspondingly disposed on the first bottom conductive pads 112. After disposing the electronic component 15, the conductive connectors 153 may be electrically connected to the first bottom conductive pads 112 and the electronic component 15 may be electrically connected to the second redistribution circuitry RDC2 through the first redistribution circuitry RDC1. In some embodiments, the first redistribution circuitry RDC1 and the second redistribution circuitry RDC2 may be referred as a fan-out structure in which the rerouting pattern connected from the first bottom conductive pads 112 to the second top conductive pads 211 are rearranged to be expanded wider than the size the electronic component 15.

Figure 1E:
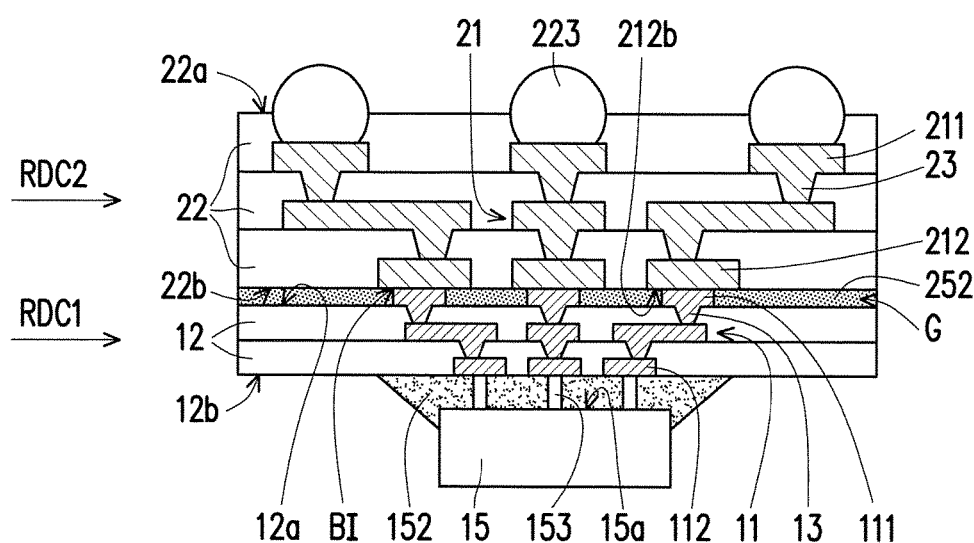

Referring to FIG. 1E, the manufacturing process of a package structure 10 is substantially completed as shown in FIG. 1E. For example, after bonding the first top conductive pads 111 of the first redistribution circuitry RDC1 and the second bottom conductive pads 212 of the second redistribution circuitry RDC2, the gap G may be filled with a bonding layer 252. For example, the bonding layer 252 is formed between the topmost one of the first dielectric layers 12 of the first redistribution circuitry RDC1 and the bottommost one of the second dielectric layers 22 of the second redistribution circuitry RDC2 to enhance the attachment between the first redistribution circuitry RDC1 and the second redistribution circuitry RDC2. In other words, after filling the gap G with the bonding layer 252, the first top conductive pads 111 of the first redistribution circuitry RDC1 are embedded in the bonding layer 252.

After forming the bonding layer 252, the bonding layer 252 may directly and physically contact the bottom surface 22b of the bottommost one of the second dielectric layers 22, and directly and physically contact the top surface 12a of the topmost one of the first dielectric layers 12. The bonding layer 252 may wrap a lateral side of each first top conductive pad 111. In other words, the first top conductive pads 111 protruding from the first dielectric layer 12 may be embedded in the bonding layer 252. In some embodiments, the bonding layer 252 may contact partial surface of the bottom surfaces 212b of the second bottom conductive pads 212.

In some embodiments, an underfill 152 may be formed in the space between the electronic component 15 and the first redistribution circuitry RDC1 to enhance the reliability of the attachment process. For example, the underfill 152 may be injected or dispensed between the electronic component 15 and the first redistribution circuitry RDC1 and may also be filled in the space (not illustrated) between a surface 15a of the electronic component 15 which the conductive connectors 153 are distributed and the first redistribution circuitry RDC1. The bonding layer 252 and the underfill 152 may be formed during the same process or the different processes, which is not limited thereto.

Compared with the conventional technique, the package structure 10 is thinner, since the first redistribution circuitry RDC1 is directly bonded to the second redistribution circuitry RDC2 without having conductive pillars formed therebetween. Therefore, miniaturizing the package structure 10 while maintaining the process simplicity is achieved.

FIG. 2A to FIG. 2E are schematic cross-sectional views of bonding area in FIG. 1A of different embodiments. FIG. 2A shows the first top conductive pads 111 and the second bottom conductive pads 212 are aligned and ready to direct bonding. In the present embodiments, the first top conductive pads 111 and the second bottom conductive pads 212 may be copper metal pads to form a copper to copper metallic bonding in the subsequent process.

In some embodiments, before bonding the first top conductive pads 111 of the first redistribution circuitry RDC1 and the second bottom conductive pads 212 of the second redistribution circuitry RDC2, an impurity may be applied on at least one of the first top conductive pads 111 or at least one of the second bottom conductive pads 212. The impurity shall form alloy with copper in the interface to enhance metallic bonding strength after bonding the first redistribution circuitry RDC1 and the second redistribution circuitry RDC2. For example, the impurity may be selected from a group consisting of nickel and gallium. Referring to FIG. 2B, a first impurity 111a may be formed on the first top conductive pads 111 to form a copper to impurity metallic bonding. For example, nickel may be applied on a top surface of the first bottom conductive pad 111 facing towards the corresponding second bottom conductive pad 212. In some alternative embodiments, a second impurity 111b may be formed on the first top conductive pads 111 instead of the first impurity 111a as shown in FIG. 2C. For example, the second impurity 111b may be gallium.

Referring to FIG. 2D, a third impurity 212a may be formed on the bottom surface 212b of the second bottom conductive pad 212 and the second impurity 111b may be formed on the first top conductive pads 111. For example, nickel may be applied on the bottom surface 212b of the second bottom conductive pad 212 and gallium be applied on the first top conductive pads 111. In some alternative embodiments, the impurity may be formed on the pairs of bonded conductive pads. For example, the third impurity 212a may be formed on the second bottom conductive pad 212, the first impurity 111a may be first formed on the first top conductive pads 111 and then the second impurity 111b may be formed on the first impurity 111a as shown in FIG.

2E. It should be noted that the more than one exemplary illustration mentioned above may be applied simultaneously on the package structure. For example, in the package structure, some pairs of the bonded conductive pads (e.g. the second bottom conductive pad 212 and the corresponding first top conductive pad 111) may be copper to copper metallic bonding as shown in FIG. 2A and some pairs of the bonded conductive pads may have the impurity applied on the first top conductive pad 111 and/or the second bottom conductive pads 212 as shown in FIG. 2B to FIG. 2E depending on the design requirements.

Based on the above, the first bottom conductive pads of the first redistribution circuitry is directly bonded to the second bottom conductive pads of the second redistribution circuitry without having conductive pillars formed therebetween. Therefore, miniaturizing the package structure while maintaining the process simplicity is achieved. Moreover, the conductive terminals are formed on the second redistribution circuitry opposite to the first redistribution circuitry for further electrical connection. In addition, the bonding layer formed between the first redistribution circuitry and the second redistribution circuitry may improve the attachment therebetween. Furthermore, the bonding interface between the first top conductive pads and the second bottom conductive pads may be a copper to copper metallic bonding. The impurity may be applied on the first top conductive pads and/or the second bottom conductive pads to enhance metallic bonding strength in the bonding interface.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure comprising:
    a first redistribution circuitry having a plurality of first top conductive pads and a plurality of first bottom conductive pads, wherein a layout density of the first bottom conductive pads is greater than a layout density of the first top conductive pads; and
    a second redistribution circuitry disposed on the first redistribution circuitry and electrically connected to the first redistribution circuitry, the second redistribution circuitry having a plurality of second top conductive pads and a plurality of second bottom conductive pads, wherein a layout density of the second bottom conductive pads is greater than a layout density of the second top conductive pads, and each of the second bottom conductive pads is directly coupled to a corresponding one of the first top conductive pads.

2. The package structure according to claim 1, wherein the first redistribution circuitry has a plurality of first patterned conductive layers and a plurality of first conductive vias, the first conductive vias electrically coupling the first patterned conductive layers, the second redistribution circuitry has a plurality of second patterned conductive layers and a plurality of second conductive vias, and the second conductive vias electrically coupling the second patterned conductive layers.

3. The package structure according to claim 2, wherein the first redistribution circuitry has a plurality of first dielectric layers overlapped with the first patterned conductive layers alternately, a topmost one of the first dielectric layers has a top surface, the first top conductive pads protrude from the top surface of the topmost one of the first dielectric layers, the second redistribution circuitry has a plurality of second dielectric layers overlapped with the second patterned conductive layers alternately, and a bottommost one of the second dielectric layers has a bottom surface coplanar with a bottom surface of the second bottom conductive pads facing towards the first redistribution circuitry.

4. The package structure according to claim 3, further comprising:
    a gap between the topmost one of the first dielectric layers of the first redistribution circuitry and the bottommost one of the second dielectric layers of the second redistribution circuitry.

5. The package structure according to claim 4, wherein the distance of the gap is equal to a thickness of the first top conductive pads of the first redistribution circuitry.

6. The package structure according to claim 4, further comprising:
    a bonding layer filling the gap between the topmost one of the first dielectric layers of the first redistribution circuitry and the bottommost one of the second dielectric layers of the second redistribution circuitry.

7. The package structure according to claim 6, wherein the first top conductive pads of the first redistribution circuitry are embedded in the bonding layer.

8. The package structure according to claim 1, further comprising:
    a bonding interface between the first top conductive pads of the first redistribution circuitry and the second bottom conductive pads of the second redistribution circuitry, wherein the bonding interface is a copper to copper metallic bonding.

9. The package structure according to claim 8, wherein the bonding interface comprises at least one impurity selected from a group consisting of nickel and gallium.

10. The package structure according to claim 1, further comprising:
    an electronic component disposed on the first redistribution circuitry opposite to the second redistribution circuitry, wherein the electronic component is electrically connected to the second redistribution circuitry through the first redistribution circuitry.

11. The package structure according to claim 1, further comprising:
    a plurality of conductive terminals disposed on the second redistribution circuitry opposite to the first redistribution circuitry, wherein the conductive terminals are electrically connected to the first redistribution circuitry through the second redistribution circuitry.

* * * * *